(12) United States Patent
Sri-Jayantha

(10) Patent No.: US 7,964,444 B2
(45) Date of Patent: Jun. 21, 2011

(54) METHOD AND APPARATUS FOR MANUFACTURING ELECTRONIC INTEGRATED CIRCUIT CHIP

(75) Inventor: Sri M. Sri-Jayantha, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 917 days.

(21) Appl. No.: 11/675,445

(22) Filed: Feb. 15, 2007

(65) Prior Publication Data

US 2008/0199986 A1    Aug. 21, 2008

(51) Int. Cl.
*H01L 21/44* (2006.01)
*H01L 21/48* (2006.01)
*H01L 21/50* (2006.01)

(52) U.S. Cl. ......... 438/106; 438/118; 438/125; 438/109

(58) Field of Classification Search .................. 438/106, 438/125, 118, 107, 109, 110
See application file for complete search history.

(56) References Cited

U.S. PATENT DOCUMENTS

| 6,014,317 | A | 1/2000 | Sylvester |
| 6,027,590 | A | 2/2000 | Sylvester |
| 6,562,662 | B2 | 5/2003 | Shisido et al. |
| 6,894,229 | B1 | 5/2005 | Cheah |
| 7,585,693 | B2 * | 9/2009 | Frutschy et al. ............... 438/55 |
| 7,759,220 | B2 * | 7/2010 | Henley ......................... 438/458 |
| 2008/0079166 | A1 * | 4/2008 | Lee et al. ....................... 257/762 |
| 2008/0315389 | A1 * | 12/2008 | Nunn ............................. 257/690 |

* cited by examiner

*Primary Examiner* — Chuong A. Luu
(74) *Attorney, Agent, or Firm* — McGinn Intelletual Property Law Group, PLLC

(57) ABSTRACT

A method (and apparatus) of assembling a die on an electronic substrate, includes processing an assembly including a substrate and a die, and during the processing, introducing a pre-stress to the assembly during a cure process.

19 Claims, 20 Drawing Sheets

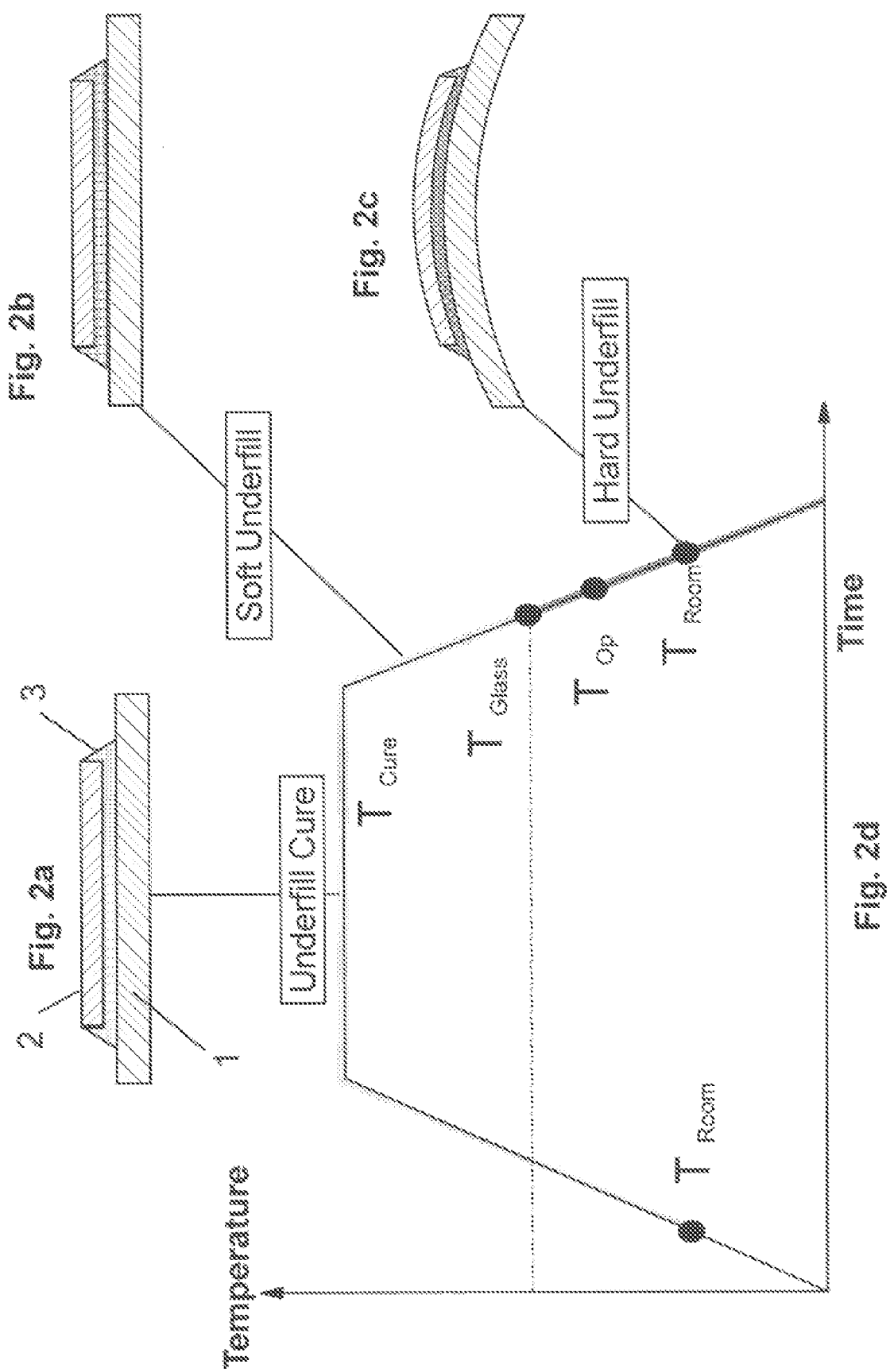

Place the chip assembly into a constraining tub with no clearence

Bring the assembly to cure temperature & then cool

Cool the assembly to room temperature & remove the tub

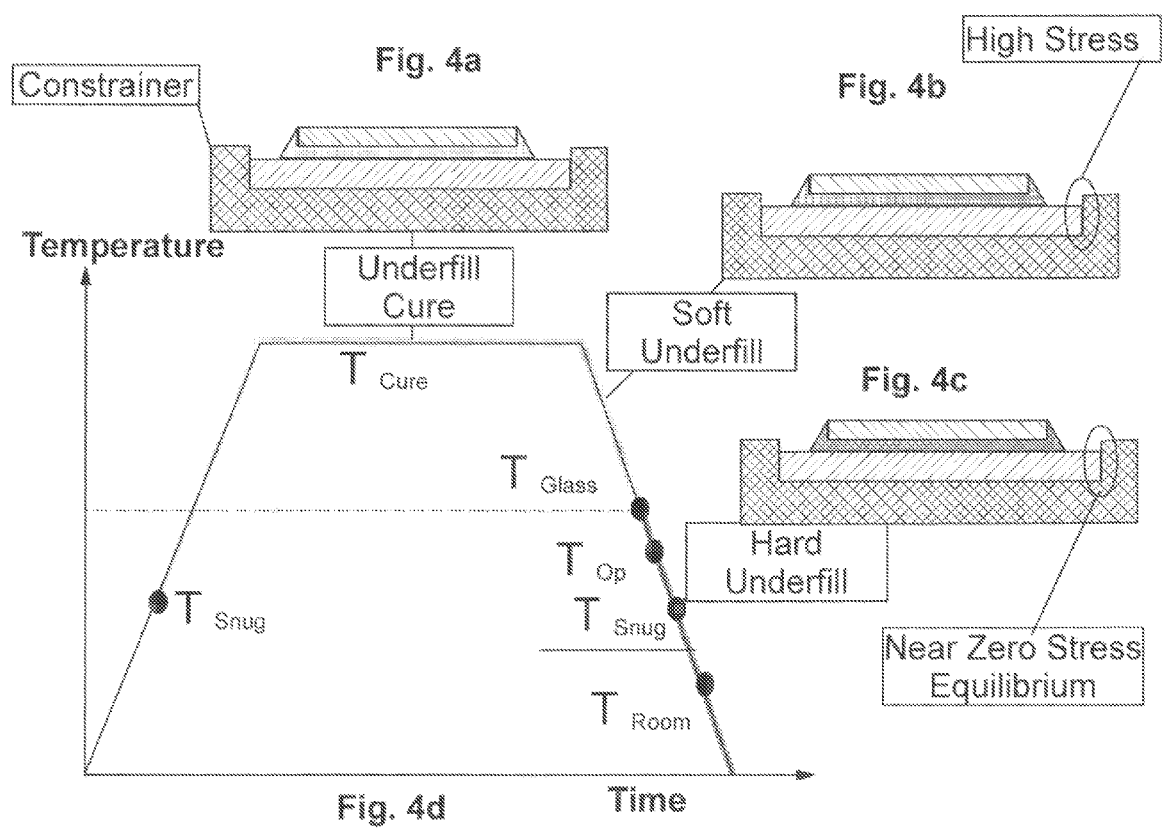

Fig. 15a  Design-1
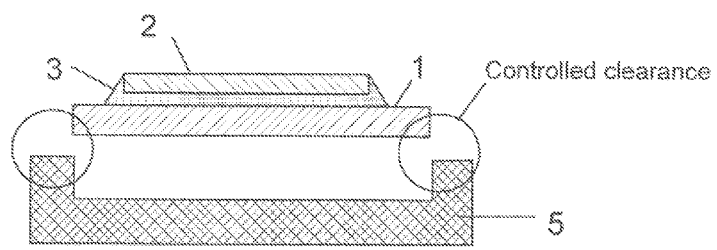
Fig. 15b  Design-2
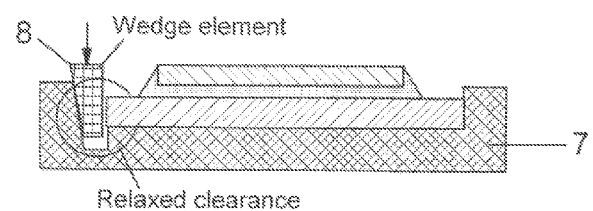
Fig. 15c  Design-3
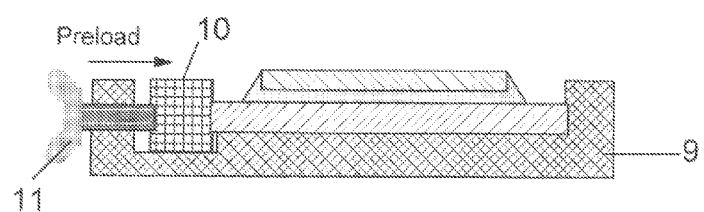
Fig. 15d  Design-4
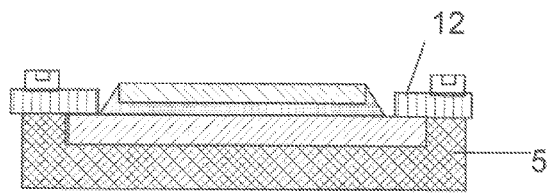

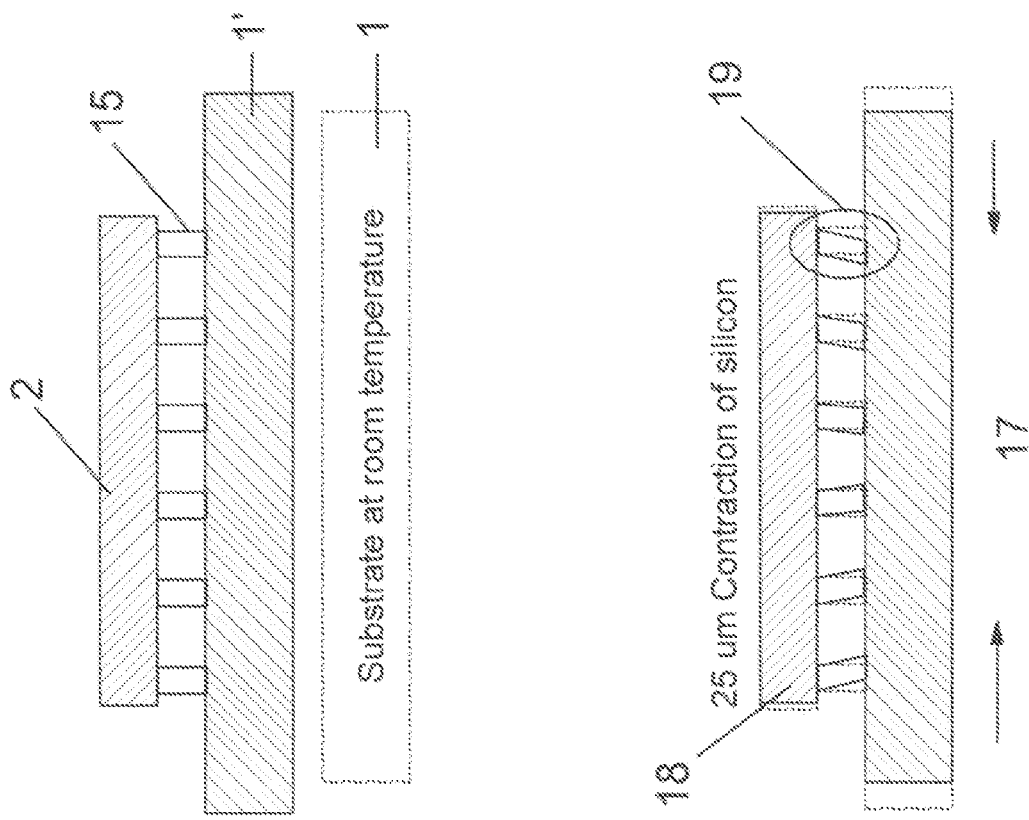

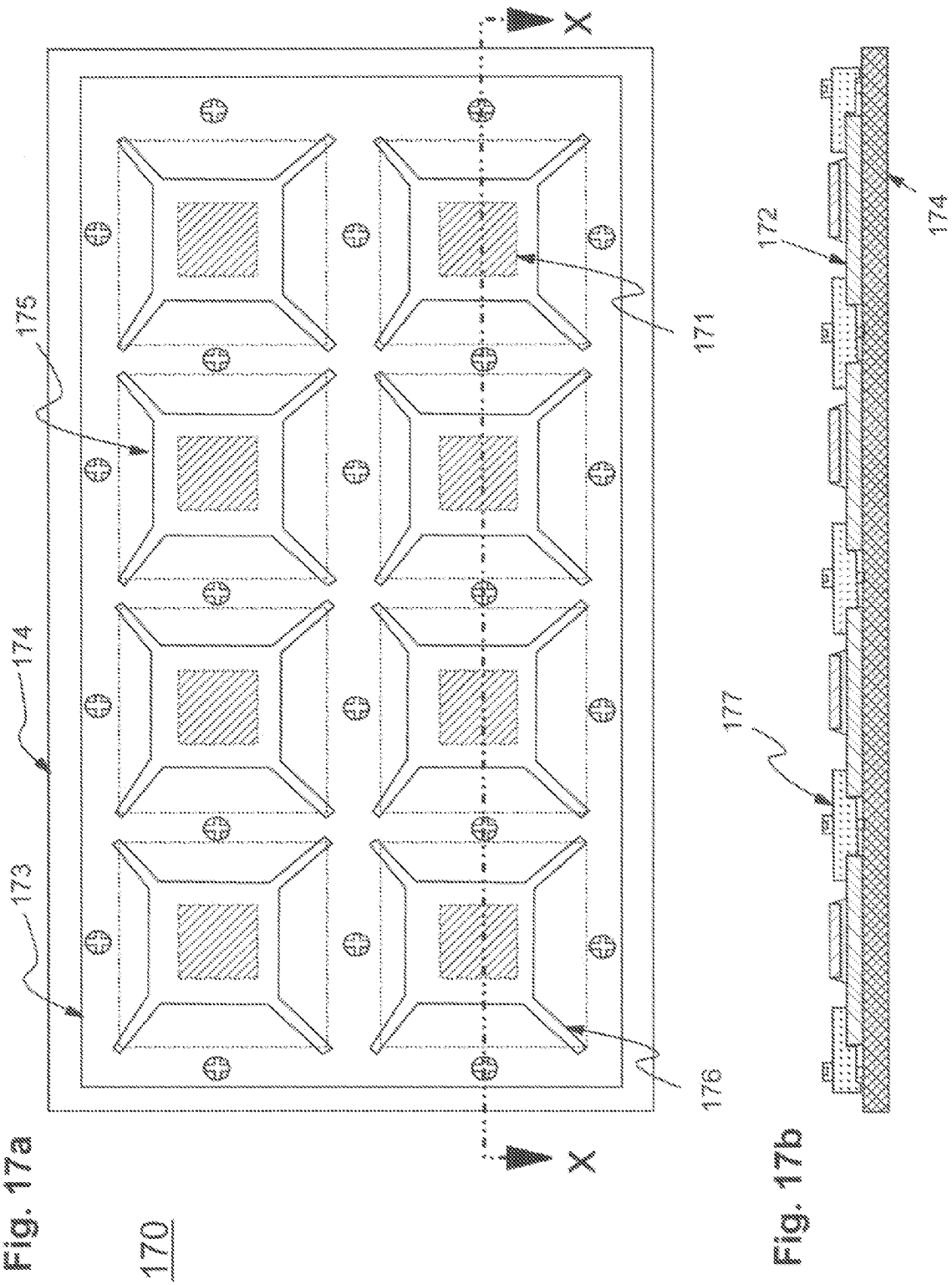

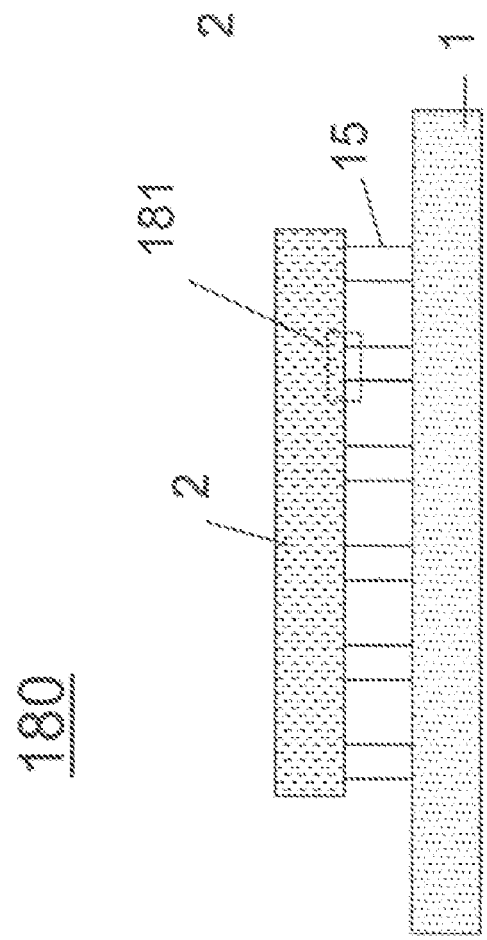
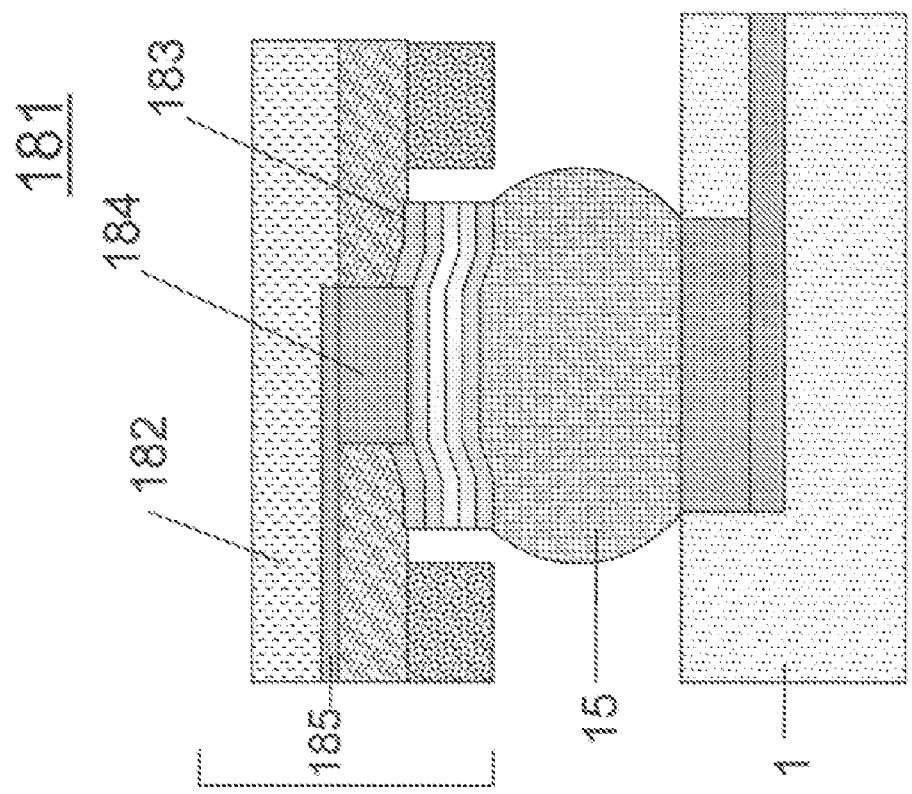
Fig. 18a
Fig. 18b

METHOD AND APPARATUS FOR MANUFACTURING ELECTRONIC INTEGRATED CIRCUIT CHIP

BACKGROUND OF THE INVENTION

1. Field of the Invention

The present invention generally relates to a method and apparatus for electronic integrated chip manufacturing with enhanced thermomechanical properties.

2. Description of the Related Art

Traditional electronic packages employ a ceramic substrate to support a silicon die, but a ceramic package is highly costly. The coefficient of thermal expansion (CTE) for both the silicon die and the ceramic are close enough (about 3 ppm/° C.) that temperature excursions do produce comparable elongation of these elements. However, any difference in CTE subject to a change in temperature could produce shear and other forms of stresses in the solder ball connections (called C4s). Further, cyclic stresses can reduce the lifetime (i.e., service life) of a C4 connection where 0-pk value of the C4 stress and substrate stress substantially contribute to the lifetime of a package.

A current trend is to migrate towards lower cost organic substrates that have superior electrical characteristics, but not so desirable mechanical characteristics. The CTE of an organic substrate could be about 15 ppm/° C. (×5). The use of an organic package heavily depends on an underfill material that reduces the stress in C4s due to thermal cycling.

An underfill with a high elastic modulus relieves stress in C4s, but exerts higher stresses on the silicon die. The CTE differential also generates a radius of curvature following a cure process, thereby raising the risk that the die may crack or fail.

On the other hand, a lower elastic modulus of underfill exposes the C4s to the CTE mismatched cyclic stress. In all cases, the CTE mismatch results in a warped assembly at room temperature. A first conventional structure includes a design where the warpage tendency is reduced by a balance plate that counteracts the substrate.

The maximum operating temperature of a die assembly including a silicon die and a substrate is always kept lower than the glass transition temperature ($T_{glass}$) of an underfill. After a cure operation at a high temperature, the assembly is allowed to cool down to room temperature. Even though the cure temperature and the $T_{glass}$ of an underfill are not identical, for simplicity they are treated as equal. The temperature excursion of Tg=125° C. to Troom=25° C. causes an assembly to warp as much as 150 μm on a 50×50 mm square substrate supporting a 20×20 mm die. This warpage is unidirectional (i.e., the die/substrate assembly goes from a planar shape to a concave system (as viewed from the die side)). The stress level in the substrate can be as high as 25 MPa in tension near the underfill zone, and compression on silicon can be as much as 30 MPa in compression.

The unidirectional warpage of the package thus creates large 0-pk excursions in warpage-induced stresses in the assembly.

Prior to the present invention, there has been no method or apparatus in which there is a new degree of design freedom in managing the warpage-free temperature of the assembly so that the 0-pk values are reduced by 50% at best.

Further, the conventional methods have not provided a method of enhancing the predicted life cycle of a self-standing assembly by reducing the peak stress by half. The reduction of peak stress during a temperature cycle reduces the extend of plastic deformation strain that is known to reduce the life cycle of a die package.

SUMMARY OF THE INVENTION

In view of the foregoing and other exemplary problems, drawbacks, and disadvantages of the conventional methods and structures, an exemplary feature of the present invention is to provide a method and structure in which an additional design freedom is provided to enhance the manufacturing and minimizing the deformation aspects of providing a die on an electronic substrate (i.e., an organic electronic substrate).

In a first exemplary aspect of the present invention, a method of assembling a die on an electronic substrate, includes processing an assembly including an electronic substrate and a die; and during the processing, introducing a pre-stress to the assembly during a cure process.

A silicon die is first attached to an electronic (e.g., organic or ceramic) substrate through a reflow process where the solder bumps are melted and allowed to form a link between the two parts. As the assembly is cooled, the melted alloy of a solder (lead/tin, lead-free, etc.) becomes solid. Due to a creep property of the solder, stress within a C4 (e.g., when the silicon die is attached to the substrate (e.g., an organic substrate)) is sufficiently relaxed after the assembly is cooled. A liquid underfill material is typically injected into the space between the die and the substrate, and a cure process is initiated. A conventional cure process subjects the substrate/silicon assembly to a cure temperature for a given length of time, and then allows the system to cool. The substrate is not subjected to any external mechanical stress control during this process.

An emerging problem in C4 solder reflow process is the reduced creep property of lead-free solder which causes excess stress around the region of the solder joint, thereby causing fracture or delamination failure of the material.

In the present invention, the substrate (e.g., organic) is constrained from expanding freely during the cure and cool-down process. By placing the substrate into a tub-like tray, made of appropriate material, the edges of the organic package are constrained to move only as much as the constraining walls of the tray would allow them to move due to temperature changes.

The cure process binds the silicon and the substrate at a pre-stressed state of the substrate, so that when the system is cooled to room temperature the residual warpage is either eliminated substantially or controlled to have a given radius of curvature (e.g., either convex or concave). With the invention, a neutral temperature point where the assembly goes from being concave to convex can be chosen by adjusting the pre-stress at a cure temperature accordingly.

With the unique and unobvious aspects of the invention, a method and apparatus is provided in which there is a new degree of design freedom in managing the warpage-free temperature of the assembly so that the 0-pk values are reduced by 50% at best. There is an industry standard that specifies the chip to be within a certain limit of warpage at room temperatures, for assembly purposes. Thus, if one wishes to control the warpage at room temperature, the present invention allows a path in which to control such warpage. Hence, for example, a design may not require perfect flatness, which would allow one to work on the edge (the limits) of the allowed warpage. The invention will allow control of the warpage.

Further, the inventive method enhances the predicted life cycle of a self-standing assembly by reducing the peak stress by half. The reduction of peak stress during a temperature cycle reduces the extent of plastic deformation strain that is known to reduce the life cycle of a die package.

Further, the invention can be applied to C4 solder reflow processes (e.g., reducing the stress induced damage following the C4 reflow process). There are two reflow processes in building a die on a mother board (system board). A first process is the C4 reflow where the die is first attached to a substrate (e.g., an organic substrate) prior to an underfill operation. A second process is where the die/substrate/underfilled assembly (called a "module") is then attached to a mother board (system board). The system board may involve a ball grid array (BGA) for connecting the module assembly to the system board. The present invention is applicable to both reflow processes in building a die on a mother board (system board).

BRIEF DESCRIPTION OF THE DRAWINGS

The foregoing and other exemplary purposes, aspects and advantages will be better understood from the following detailed description of an exemplary embodiment of the invention with reference to the drawings, in which:

FIGS. 2a-2d show a corresponding state of the assembly during the cure and cool-down phases;

FIG. 4a-4d show the effect of a mechanical constraint producing tray 5 used according to the invention;

FIGS. 15a-15f show various methods of obtaining a snug-fit without tight tolerance control requirements;

FIGS. 16a-16b show a conventional method directed to reflow, whereas

FIG. 17a illustrates a top view of a plurality (e.g., 8) die/substrate assemblies on a manufacturing tray, and FIG. 17b illustrates a cross-section al view of the structure shown in FIG. 17a along lines X-X thereof; and FIG. 18a illustrates a cross-section of a ball limiting metal (BLM) structure 180, and FIG. 18b illustrates detail 181 of the structure 180 shown in FIG. 18a.

DETAILED DESCRIPTION OF EXEMPLARY EMBODIMENTS OF THE INVENTION

Figure 1A:
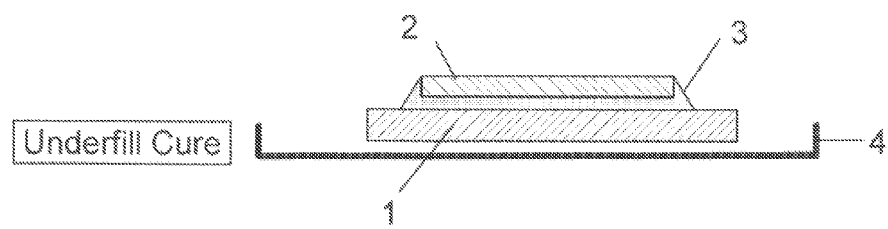
FIGS. 1a-1c show three stages of a die 2/substrate 1/underfill 3 assembly during a cure cycle.

Referring now to the drawings, and more particularly to FIGS. 1-18b, there are shown exemplary embodiments of the methods and structures according to the present invention.

Exemplary Embodiment

Figure 1B:
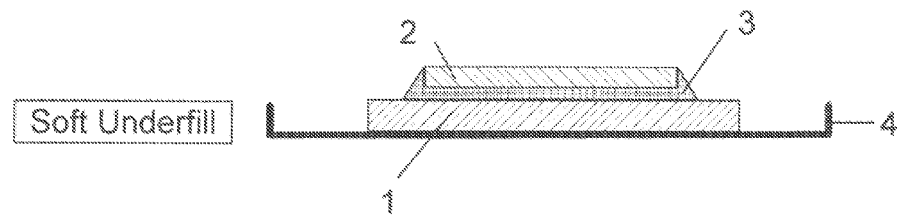
Figure 1C:
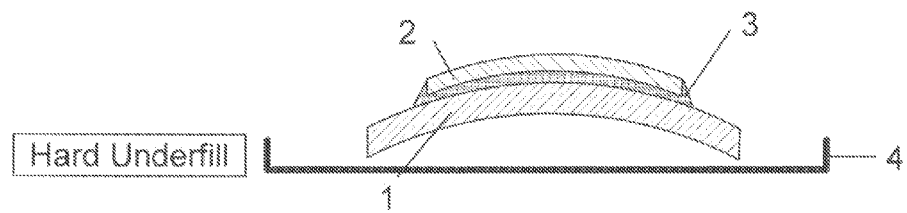

FIGS. 1a-1c show three stages of a die 2/substrate 1/underfill 3 assembly during a cure cycle. Substrate 1 and die (chip) 2 that have already been joined through a reflow process, are injected with an underfill 3 and placed in a tray 4.

FIG. 1a shows the underfill 3 that is soft at a beginning of a cure process during which it becomes thermally set as it is cured. The underfill material 3 is generally soft above its glass transition temperature ($T_{glass}$). As the glass transition temperature is crossed, as shown in FIG. 1b, the hardened underfill 3 essentially locks the substrate 1 and the silicon (die 2) at their freely expanded state near the glass transition temperature ($T_{glass}$).

As the package is cooled, the substrate 1 (e.g., with 5× CTE) shrinks by five (5×) times more in length than the silicon, thereby creating a warped geometry, as shown in FIG. 1c. The CTE of the underfill 3 is about 50 ppm/° C. below $T_{glass}$ and underfill 3 is also subject to a tensile stress while the lower CTE silicon undergoes a compressive deformation near the underfill zone.

FIGS. 2a-2d show details of shrinkage of the corresponding assembly during the cure and cool-down phase, according to the conventional (e.g., related art, not prior art) method.

FIG. 2a shows the assembly during the cure temperature. FIG. 2b shows the freely expanded positions of die 2 and substrate 1 near the edge of a die 2 at $T_{glass}$.

As the temperature drops below $T_{glass}$, the free position of the die 2 is shown, and that of the substrate 1 is similarly shown. However, because of the hardened underfill 3, the equilibrium point at room temperature is reached.

FIG. 2d (and similarly in FIG. 4d described below) shows the temperature vs. time trace of a cure process.

While FIG. 2d shows the $T_{glass}$ is below that of $T_{cure}$, in real world applications $T_{cure}$ may be below $T_{glass}$ and indeed independently chosen. It is noted that $T_{cure}$ shown in FIG. 2d is the temperature at which the thermosetting material is subjected to in an oven. The higher the $T_{cure}$ the faster the material will be cured into a chemically bonded composition. Prior to curing, the material may be considered as a fluid and there is no stress between these parts, whereas after curing (setting) there is stress between the parts. Thus, such material will act as a rigid body connecting the chip and the substrate. At that moment, the solidified (rigid) object has its own $T_{glass}$ which is independent of $T_{cure}$. Hence, $T_{glass}$ could be higher (or lower) than $T_{cure}$.

Figure 3A:
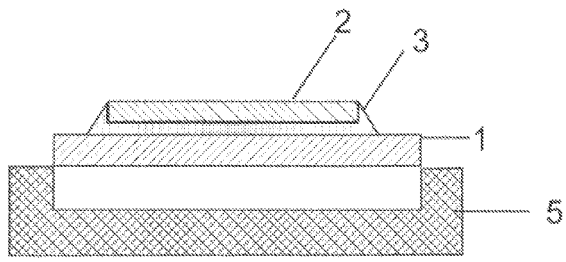
FIGS. 3a-3c show a method and apparatus involved in the present invention.
Figure 3B:
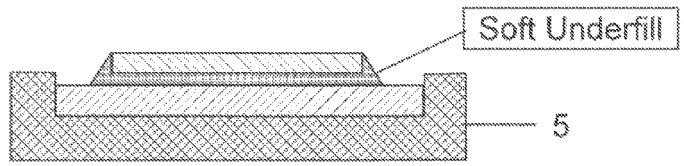
Figure 3C:
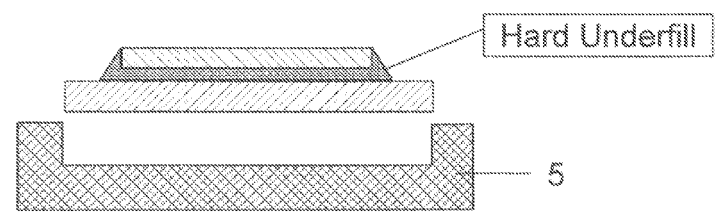

FIGS. 3a-3c show some of the exemplary steps involved in the present invention.

FIG. 3a shows the substrate 1 as it is placed in a tub-like tray 5 at room temperature. Tray 4 in FIG. 1a is different from Tray 5 of FIG. 3a in that the tray 4 has a relaxed geometry to hold an assembly, whereas tray 5 is shaped carefully to meet the requirements of a snug-fit where the gap between the substrate edge and the walls of the tray is carefully determined or controlled. For example, the gap may be selected exemplarily to be 2-3 mils, depending upon the material, and/or temperature utilized, etc. Of course, such a value is only for a very static tray design and the present specification shows various tray designs in which the gap can be closed comfortably without ever knowing a-priori the gap manufacturing tolerances/dimensions. Thus, the invention is not limited to such a gap dimension.

The substrate 1 snugly fits into the tray 5 at a temperature denoted by Tsnug. For simplicity, the snug-fit is assured at a predetermined temperature (e.g., at room temperature Troom). Since there is a snug-fit, there is no clearance which would allow the substrate to expand any more than tray 5 would allow it to expand. For conventional sized substrates (e.g., on the order of about 50 mm), it is noted that clearance could be nominally limited (controllable) between 0-20 mils depending upon the substrate size, geometry, CTE values, etc.

The die 2/substrate 1 assembly is now put through the identical cure process cycle as described before. Once the assembly is cured and cooled, the tray 5 is removed from the assembly. The assembly should be free of warpage at the temperature it snugly fits the tray 5.

The tray 4 material in this case is chosen to have identical CTE to that of die 2. Interestingly, the warpage characteristics can be imparted to the assembly by choosing a tray material having a different CTE and/or different clearance associated with snug fit. Preferably, the tray is formed of silicon, ceramic material, or artificial/synthetic material has a CTE comparable to a CTE of silicon (e.g., about 3). Of course, any materials may be chosen depending upon the designer's constraints and requirements.

Thus, tray 5 functions as a constrainer and allows warpage characteristics to be controlled by suitably selecting the materials for tray 5 and/or by selecting a controlled clearance between the wall(s) of the tray 5 and the substrate 1.

FIGS. 4a-4d show the effect of tray 5 that produces the mechanical constraints.

FIG. 4a shows the cure condition where the substrate 1 is mechanically constrained by tray 5 while the underfill 3 is being thermally set during the cure process.

FIG. 4b shows a pre-strain (pre-stress) produced by the tray 5 on substrate 1. The pre-stress imparted on the substrate 1 is borne by the tray 5 and not by the underfill 3 or silicon 2 at lower than $T_{glass}$ temperatures.

However due to a difference in the underfill CTE relative to that of silicon 2, there will be a residual build-up of stress. However, such residual build-up of stress is deemed to be less significant, because of the elastic modulus of an underfill is relatively low compared to that of silicon. By having the material of tray 5 contract by the substantially identical amount as the die 2, the assembly cools down to a nearly stress-free state at lower temperature, as discussed below.

FIG. 4c shows the relative positions of the edges of the substrate and the tray 5 compared to a conventional cure case described above with reference to FIG. 2c.

FIG. 4d describes a temperature vs. time trace of a cure process.

Thus, instead of having a very large unidirectional strain when going from high temperature to low temperature, the invention can move the neutral point halfway so that the strain amplitude can be decreased by a factor of 2.

Along these lines, for example, there is elastic strain and plastic strain as known. Assume that the strain is 5 microns and that elastic strain is ±1 micron and plastic strain is ±4 microns (5 microns total).

Now since the neutral point has been shifted halfway between, there is a shift of strain of 2.5. Thus, the plastic strain is brought down from 4 microns to 1.5 microns, thereby increasing the life of the solder due to the decrease in strain.

Figure 5:
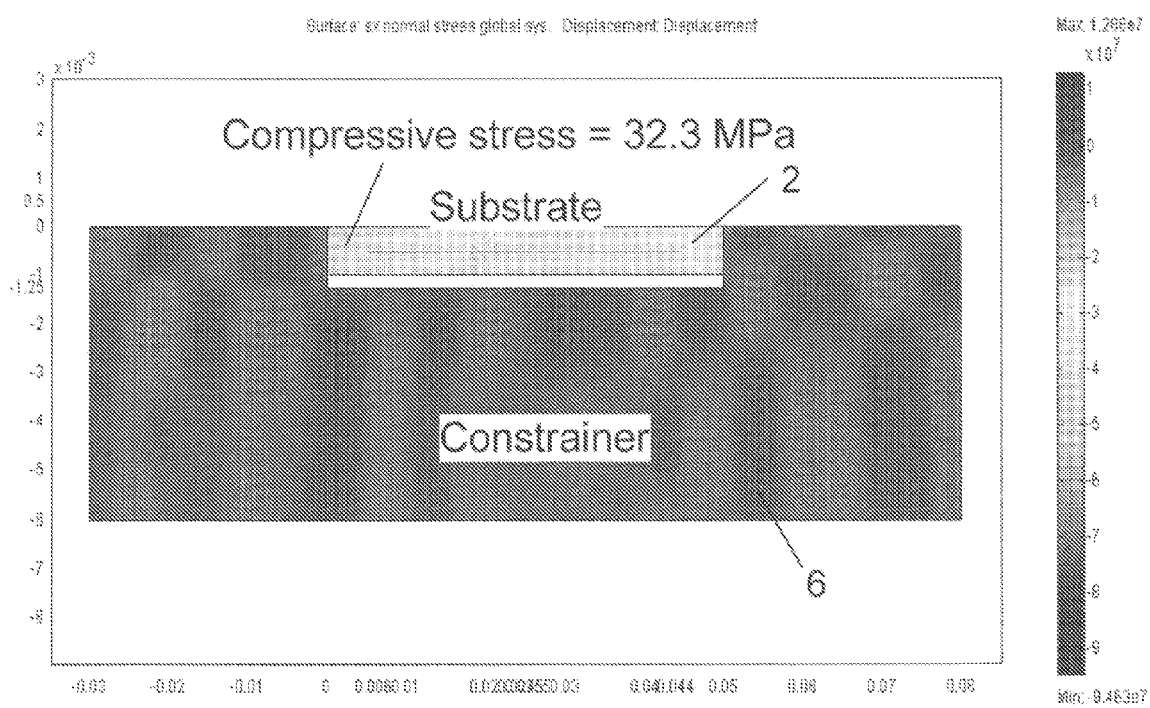
FIG. 5 depicts a stress plot of a substrate 1/tray 5 system when heated from 25° C. to 125° C.

FIG. 5 depicts a stress plot of a system including a substrate 1 and a constrainer (e.g., tray) 6 when heated from 25° C. to 125° C. It is noted that the substrate 1 undergoes a compressive stress of 32.3 MPa. The constraining tray 6, made to a thickness of 6 mm with surrounding walls only 3 mm wide, is subject to a tensile stress at 125° C. Estimates show that the composite system warps by about 3 µm due to this stress. The geometrical parameters of tray 6 can be changed to reduce the warpage at 125° C. below 3 µm, but compared to 150 µm warp of a typical substrate/die assembly, a 3 µm warpage is not considered significant. It is noted that the above temperature values, properties, and dimensions are exemplary and illustrative only and should not be construed as limiting the present invention, as would be known by one of ordinary skill in the art taking the present application as a whole.

Thus, FIG. 5 shows that not only providing a snug-fit of the substrate 2 into the constrainer/tray 6 provides benefits, but also selecting a different type of initial compressive stress provides benefits.

Figure 6:
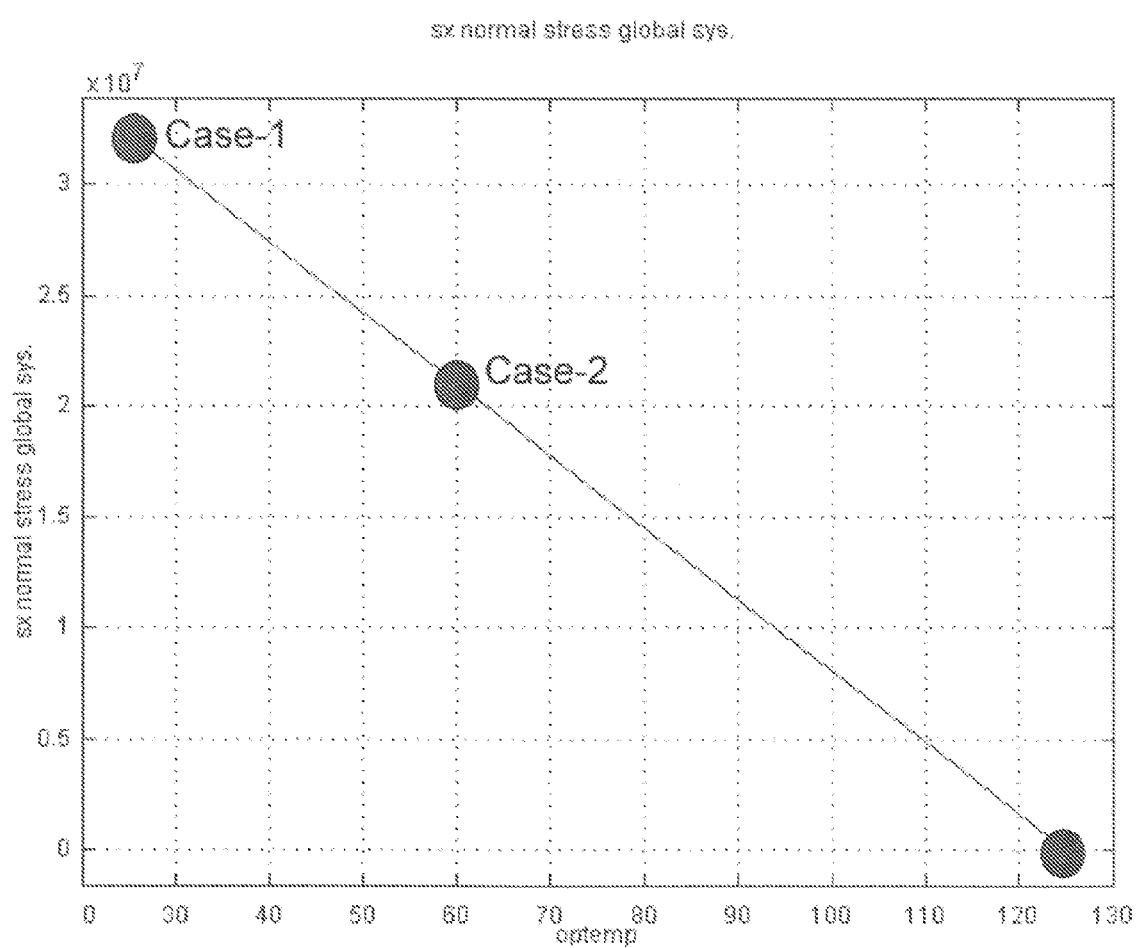
FIG. 6 shows two cases of stress buildup when temperature reaches 125° C. from a stress-free state.

FIG. 6 shows two cases (e.g., case 1 and case 2) derived for the configuration shown in FIG. 5. A goal is to estimate the pre-stress necessary at cure temperature, so that a stress-free condition can be obtained at a target temperature (which is referred to as an "operating temperature of the die/substrate system"). The cure temperature is set to 125° C.

Figure 7:
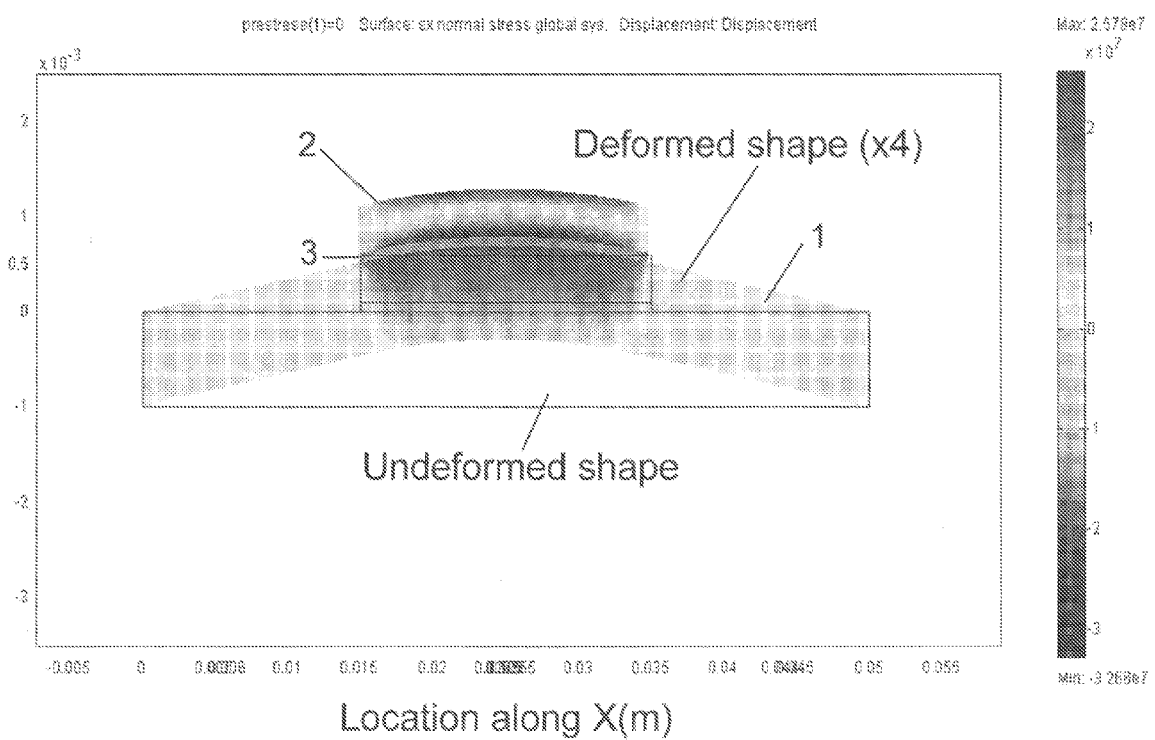
FIG. 7 shows an effect of curing by conventional means.

When the system is heated up to 125° C. from the operating temperature, the compressive stress builds up linearly, as shown in FIG. 7. Case-1, for example, corresponds to a compressive stress of 32.3 MPa at 25° C. if the system is cooled from a stress-free state at 125° C.

FIG. 7 shows an effect of curing of a die/substrate system with an underfill by conventional means. The finite element analysis (FEM) assumes a two-dimensional formulation. The warpage at room temperature is shown by the deformed shape (×4).

Figure 8:
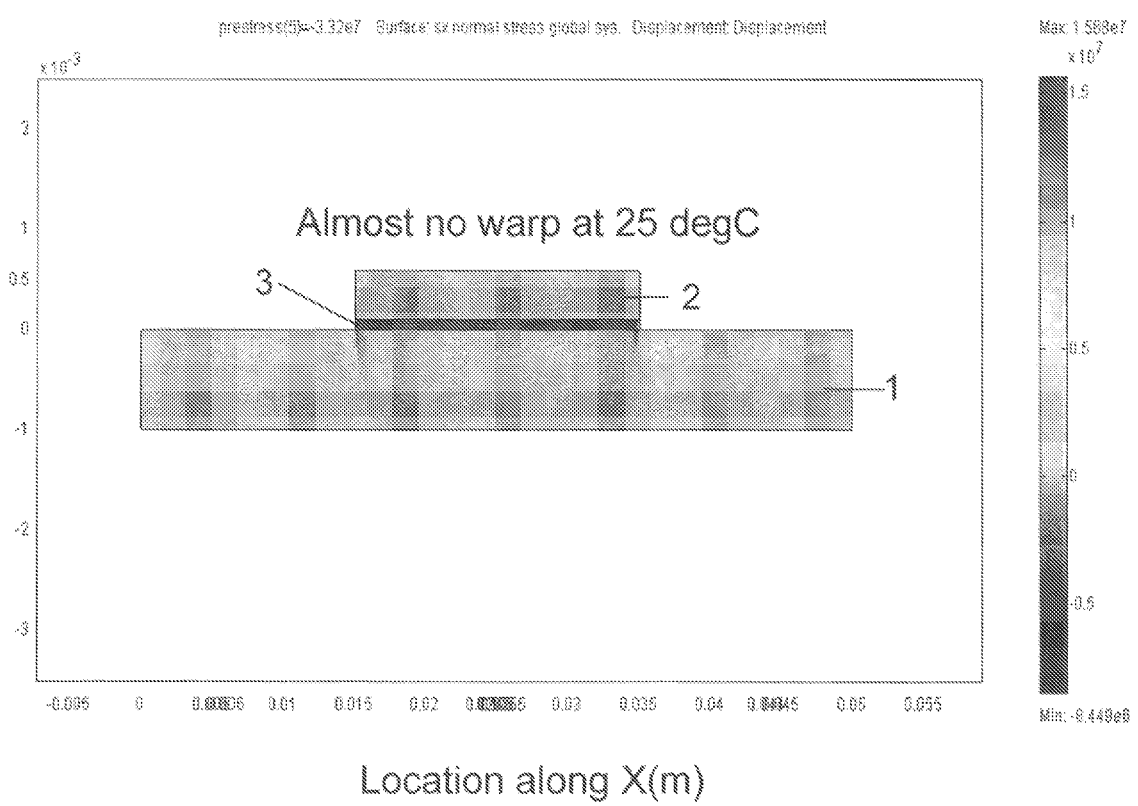
FIG. 8 shows an effect of a constrained cure process (CCP)

FIG. 8 shows an effect of a constrained cure process (CCP) according to the inventive technique. A compressive pre-stress of 32.3 MPa is applied to the substrate at 125° C., and the package is brought to (cooled to) 25° C. The deformation-free package with a near-zero internal stress in silicon and substrate is observed.

Figure 9:
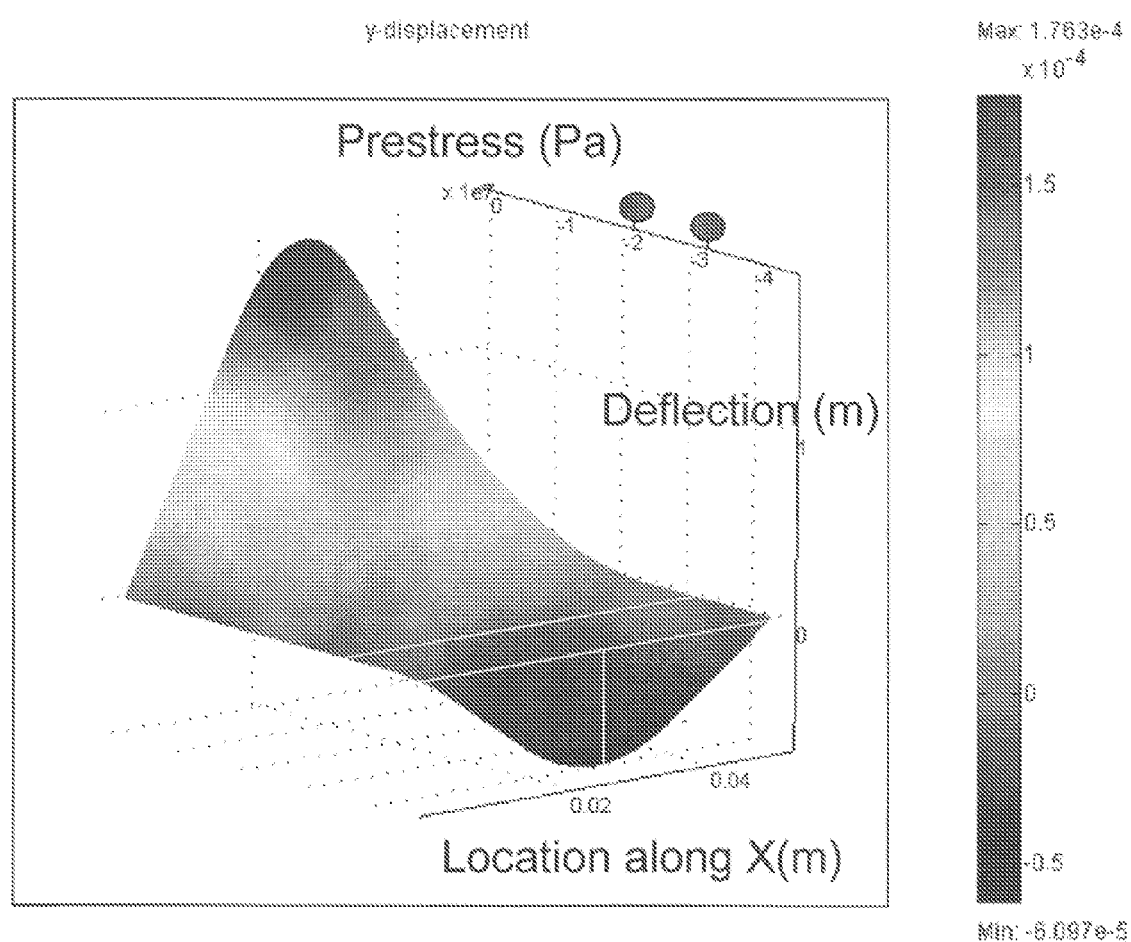
FIG. 9 shows a sensitivity of warpage-magnitude at 25° C. on the magnitude of applied pre-stress at 125° C.

FIG. 9 shows a sensitivity of warp-magnitude at 25° C. on the magnitude of applied pre-stress at 125° C. The pre-stress is varied from 0 MPa to −45 MPa. A concave shape becomes convex through a transition where the warpage is near zero. Thus, by controlling the pre-stress (shown at the top horizontal axis), warpage can be advantageously changed (controlled) at room temperature.

Figure 10:
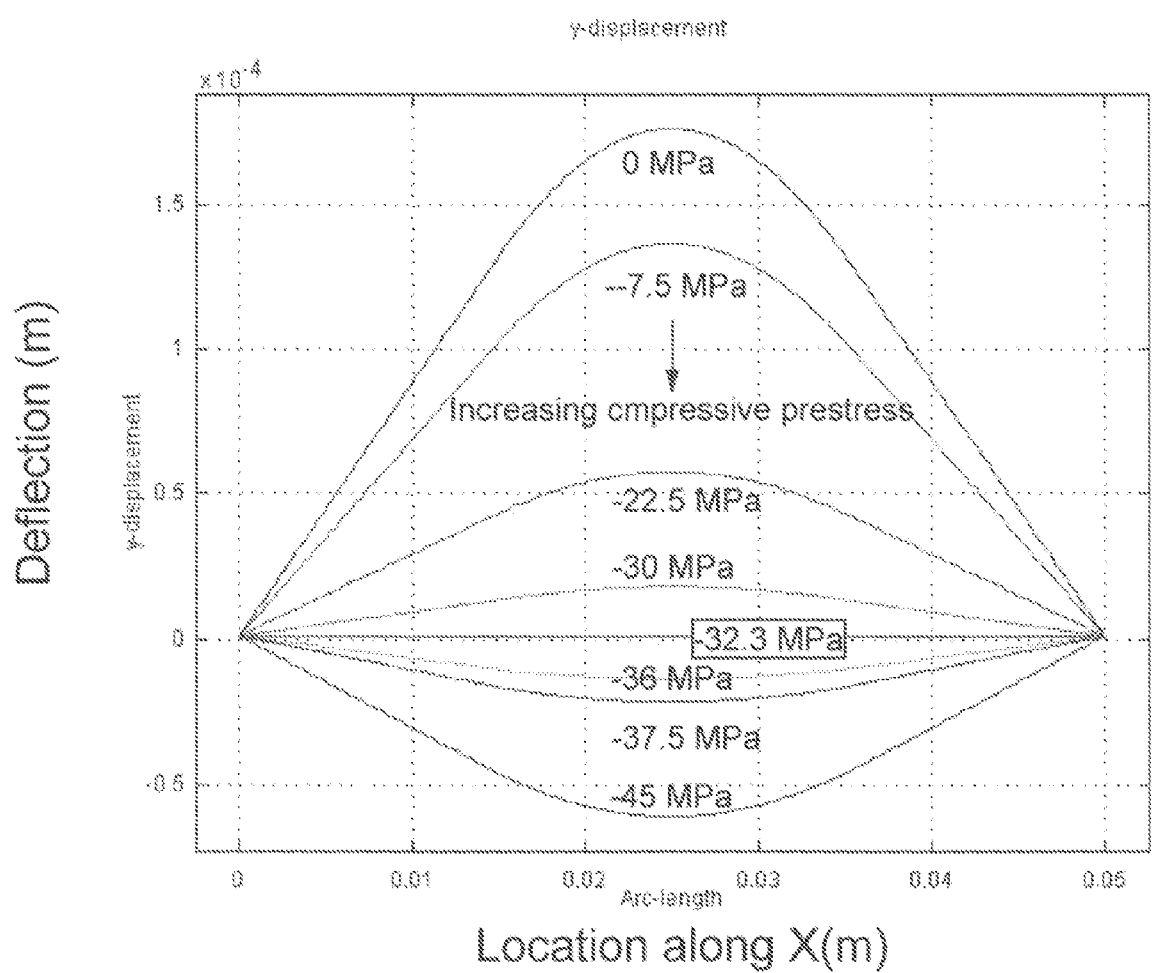
FIG. 10 is a line plot of the corresponding surface plot of warpage of FIG. 9.

FIG. 10 is a line plot of the corresponding surface plot of warpage of FIG. 9. For example, with 0 MPa pre-stress at 125° C. a warpage deflection of 180 µm is observed. If the substrate is over-stressed, for example, with 45 MPa of compressive stress, then a warpage deflection of 60 µm in the opposite direction can be observed.

Figure 11:
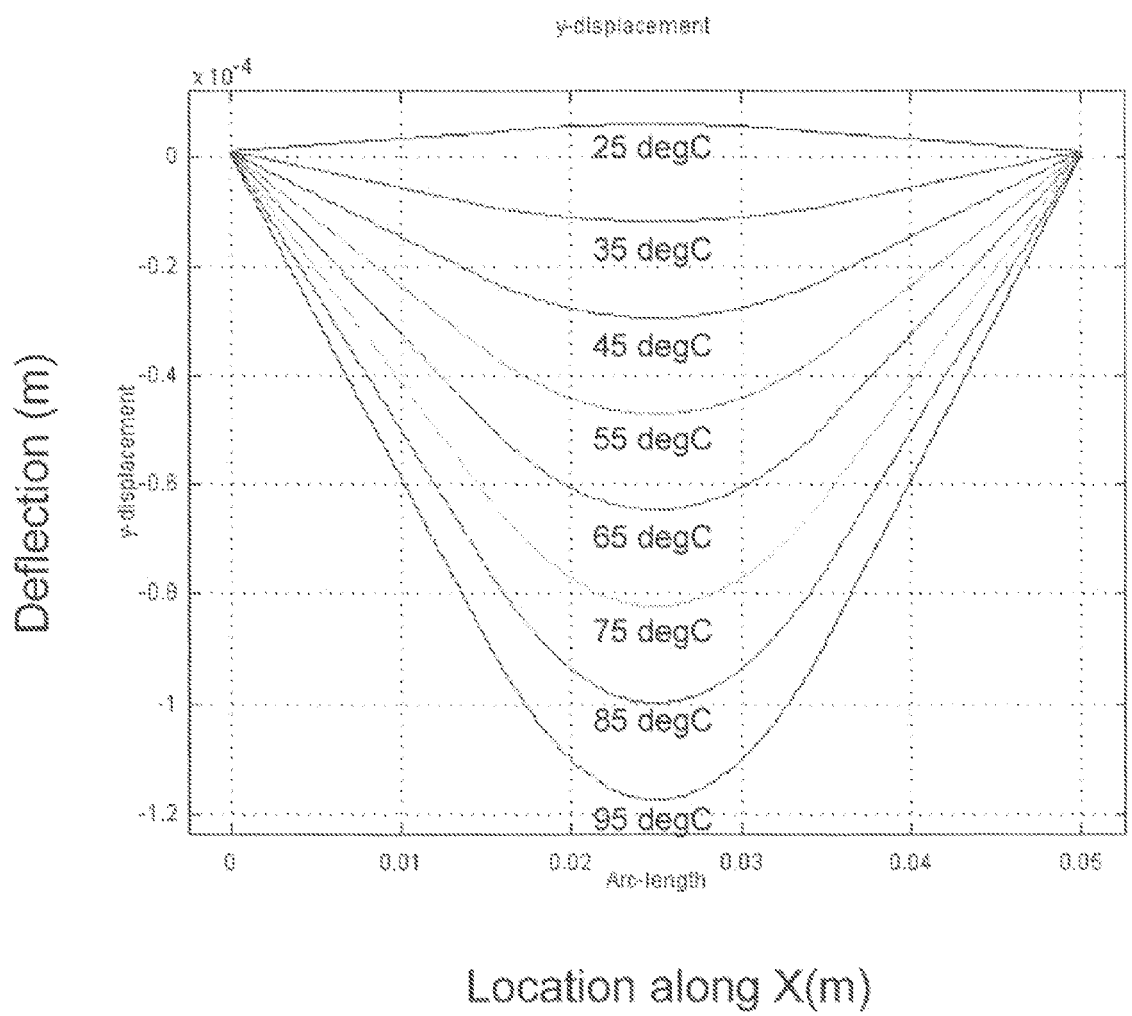
FIG. 11 shows that an increase in warpage due to a pre-stress of −32.3 MPa.

Since the operating temperature of the die can vary during a test, it is important to know how the temperature of the assembly for a given pre-stress affects its warpage level. FIG. 11 shows that the warpage increases from 10 µm (concave) to −120 µm (convex), as the temperature increases.

Figure 12:
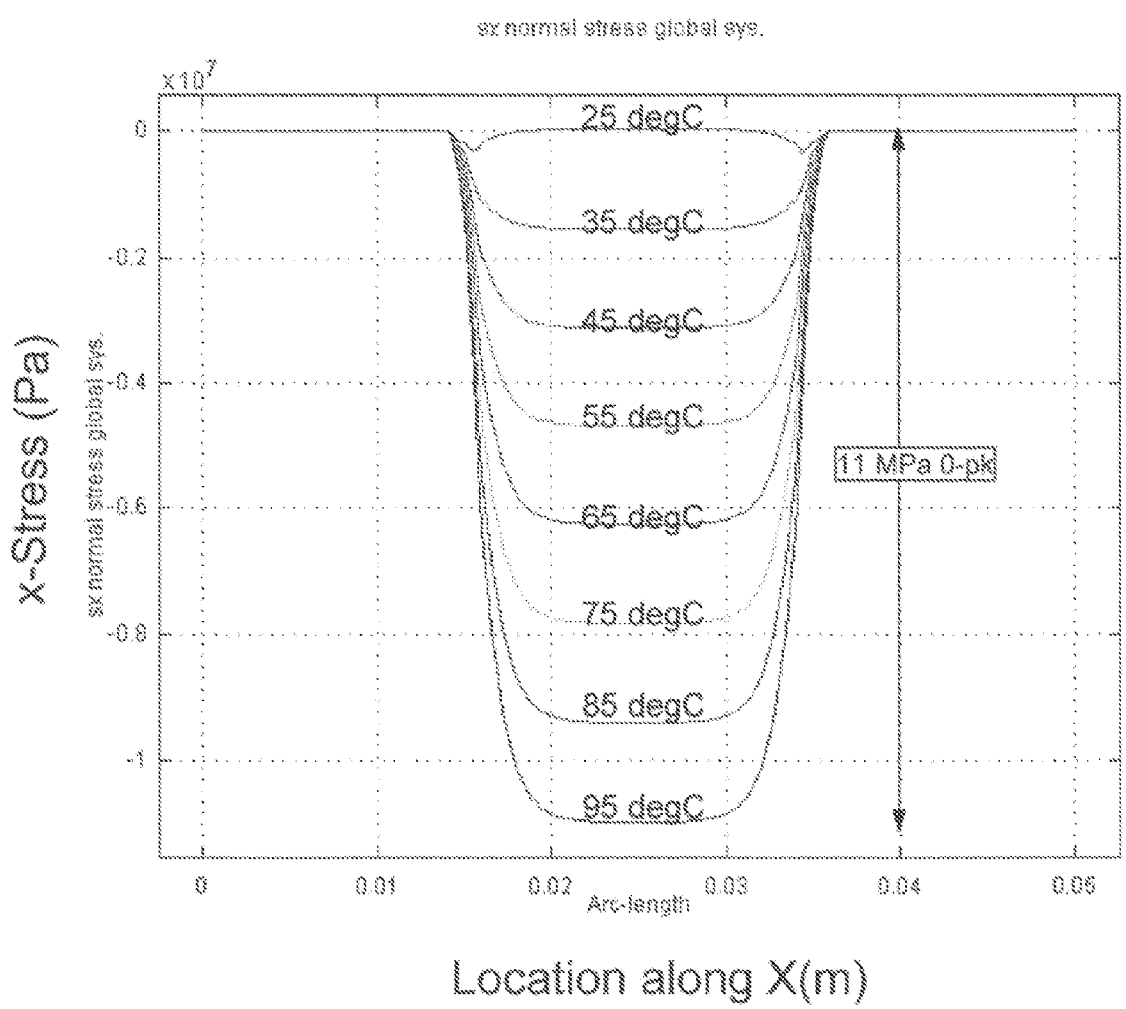
FIG. 12 shows a peak stress in the substrate (−32.3 MPa pre-stress)

FIG. 12 shows the corresponding stress in the mid-plane of the organic substrate, and it increases from near zero to 11 MPa.

Once the assembly is cured, it is tested under different test criteria. For example, if the assembly is likely to operate between 25° C. and 95° C., then it may be optimal to make the mid-temperature point (~60° C.) as the warp-free and stress-free state. This objective can be achieved by setting the pre-stress (from FIG. 6) corresponding to 60° C. which is −21 MPa.

Figure 13:
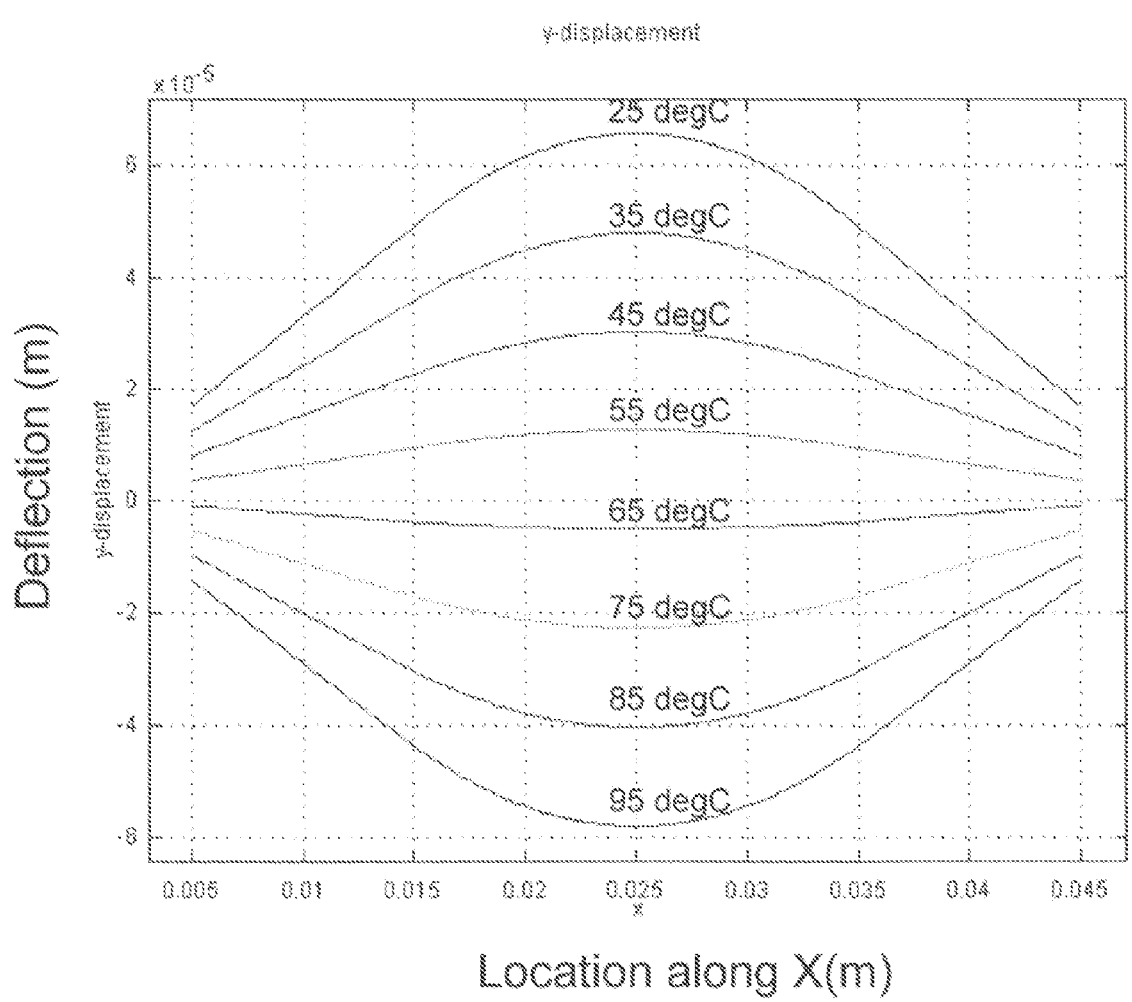
FIG. 13 shows an effect of warpage due to a pre-stress of −21 MPa.

FIG. 13 shows an effect of warpage due to a pre-stress of −21 MPa. It can be observed that the warpage is nearly symmetric about 60° C. case (e.g., the snug-fit temperature can be selected to be this temperature). The pk-pk deflection of ~120 µm is preserved regardless of the pre-stress, but the maximum warpage deflection value 0-pk is now reduced to 60 um.

Figure 14:
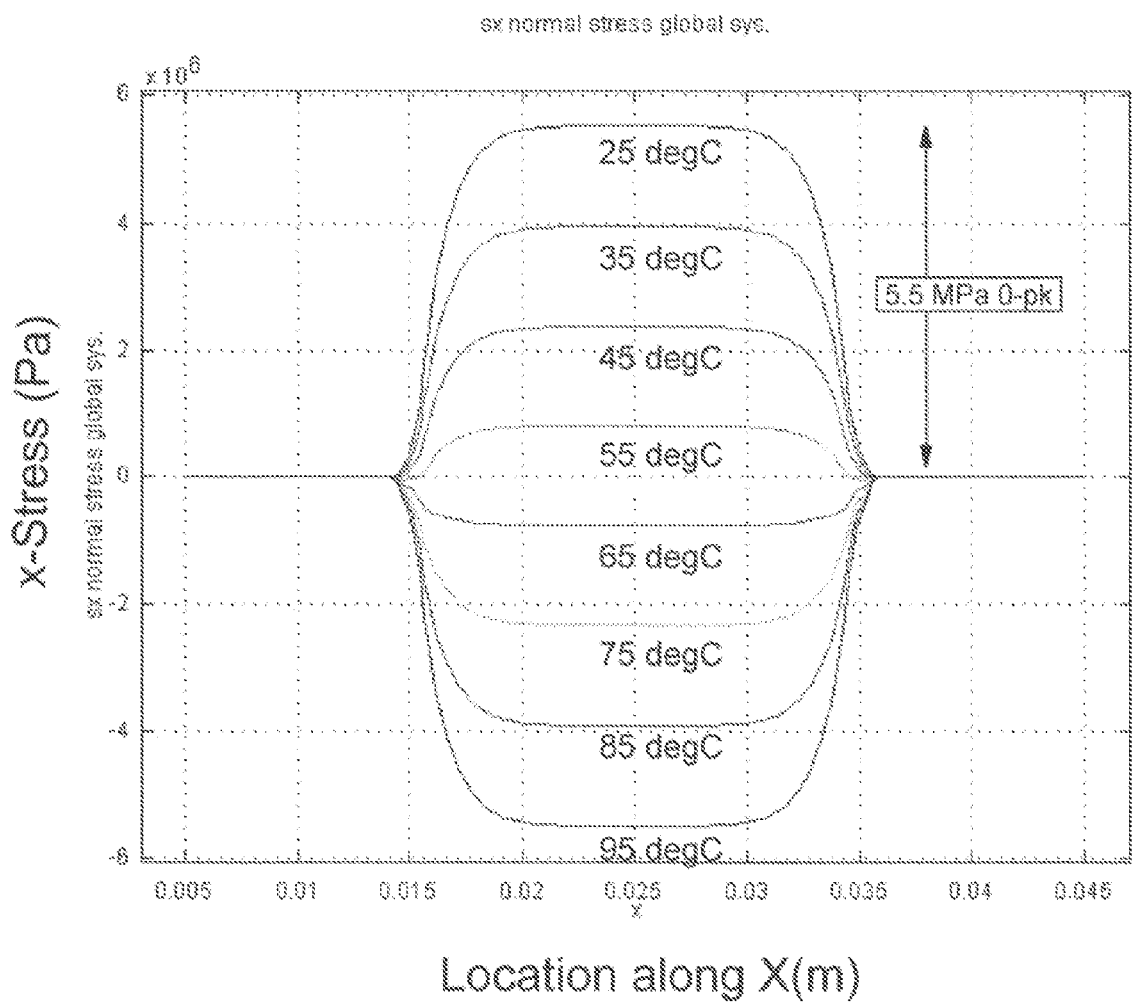
FIG. 14 shows a peak stress in the substrate (−21 MPa pre-stress)

FIG. 14 shows a corresponding peak stress in the substrate 1 which is reduced to 5.5 MPa. Stress in silicon as well as in C4s should see a corresponding reduction, thereby enhancing their failure boundary.

Thus, FIGS. 9-14 show that there are many design freedoms with the present invention (e.g., there are many parameters that may be varied to achieve the designer's objects).

It is noted that organic substrates are produced in large sheets (e.g., 25×25 cm) and then sliced into multiple pieces of smaller dimension (e.g., 50×50 mm). The slicing operation is a rough cutting process and does not produce samples with precise or predictable lengths. A length variation of the order of 0.1 mm is easily possible. Thus, the tolerance control is important in order to get desired mechanical fit.

FIGS. 15a-15f show various methods of obtaining a snug-fit. A goal is to seek a design that will not require tight tolerance control of the tub assembly referred to as "fixtures."

A substrate with CTE=20 ppm/C with a 50 mm square dimension can freely expand by 50×100×20/(1000) micrometer on each side for a temperature rise of 100° C. This corresponds to 100 micrometers or 4 thousandths of an inch. To constrain the motion of the substrate, the clearance should be controlled well within this range. A substrate-to-tub-wall clearance greater than 100 micrometers will have no impact on warpage mechanics since the substrate will never contact the tub-wall (in this example for a 100° C. rise). Hence, it is important to control the clearance or pre-load as desired by providing design functions to the fixturing.

Design-1 of FIG. 15a is the simplest case, but would require tighter tolerancing of the tub (tray) 5.

Design-2 of FIG. 15b relieves the dimensional tolerance by allowing a wedge-like insert 8 to constrain the substrate and tub (tray) 7 has a wall clearance larger than that of tub (tray) 5. The material of wedge 8 preferably is made of a material the same (or substantially the same) as that of tub (tray) 5 material. The shape of the wedge shape element is preferably formed to fill in the clearance. A plurality of such wedge elements (e.g., one on each side) may be provided or only one wedge element may be provided, as desired.

It is noted, for example, that placing the wedge-like insert 8 to fill the gap, without introducing a substantial pre-load, a flat warpage-free condition is just that. In other words, pre-stress is 0, but it is not allowed to expand any further. The wedge insert is considered still to impart a stress onto the tray, by the fact that the insert touches the substrate 1. It is simply the case that no expansion is allowed. The act of touching the substrate introduces some stress.

Design-3 of FIG. 15c has an adjustable pre-load option. A sliding block 10 is activated by a pressure (e.g., a thumbscrew device or the like) device 11. This feature allows not only a relaxed tolerance of the fixturing, but also allows one to impart either a pre-load at room temperature, or insert a predefined clearance between the substrate 1 and the tub 9 wall, thereby helping to move the warpage-free state to a temperature below room temperature.

It is noted that the design-3 could be combined with Design-2. That is, the adjustable pre-load option could be used to place a pre-load on the wedge insert between the tray and the substrate. Alternatively, the thumbscrew device (or the like) could be placed directly on the substrate to impart the pre-load directly onto the substrate.

Design-4, which could be combined with design-2 and/or design-3, shown in FIG. 15d illustrates a method to seat the substrate without allowing it to buckle under compressive stresses generated by the thermal expansion process. A top plate 12 is added to the tub (tray) 5 or any other tubs (trays) 7 or 9, to prevent buckling of the substrate. Thus, as strain builds up as the temperature increases, the top plate prevents buckling of the substrate. Preferably, top plate 12 is formed of a material having a CTE substantially that of silicon (or about 3).

Figure 15E:
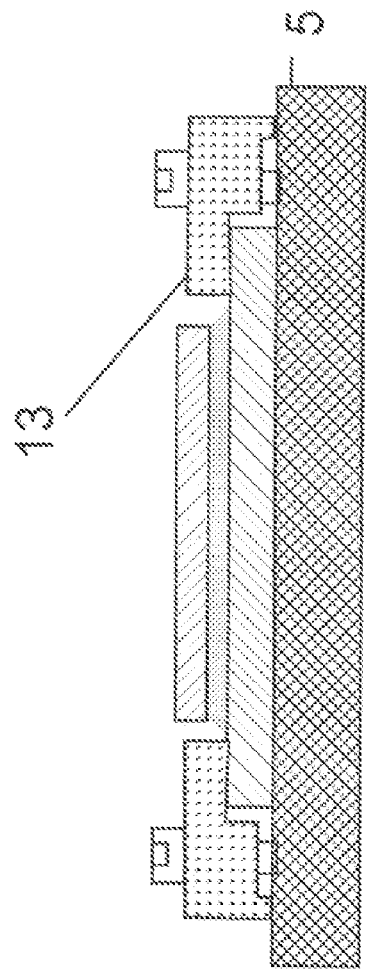

Design-5 (which could also be combined with any one or more of the previously described designs) of FIG. 15e shows a design where a top plate 13 provides a dual function. That is, in addition to preventing buckling, design-5 constrains the substrate to the surface of the conventional tub through friction so that the tub walls are no longer required. The surface of the tub 5 and the top plate 13 can be made rough in order to provide the constraining function. Preferably, top plate 13 is formed of a material having a CTE substantially that of silicon (or about 3).

Figure 15F:
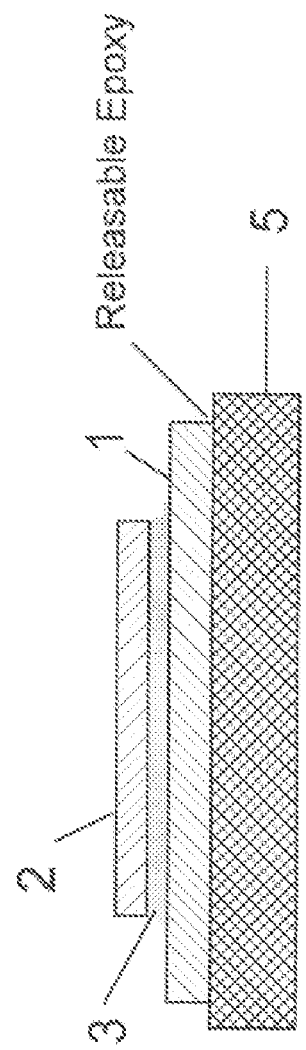

Design-6 in FIG. 15f is another option where an epoxy 14 is used to attach the substrate to the tub 5 surface prior to the underfill 3 cure operation. Once the assembly is cured and brought to room temperature, the substrate 1 is released through a special process such as laser ablation or through a chemical process.

Again, as mentioned above, the material for the tray (tub) can be preferably ceramic with a CTE similar to that of the silicon die 2.

Similar constrained reflow process with non-creeping solder (e.g., lead-free) of the future can be envisaged.

When attaching the substrate/die assembly on a mother board (e.g., system board), the motherboard can also be similarly constrained to achieve lower stress connection at its solder joints.

As exemplarily described above, the present invention focused in controlling the warp and stress following the underfill operation. However, the same method can be used in the reflow operation of C4 solder prior to the use of underfill.

In this case, the stress produced in the C4 and surrounding elements such as ball limiting metal (BLM) during the reflow cool-down operation can be managed using the same method of clearance or pre-load control.

Figure 16C:
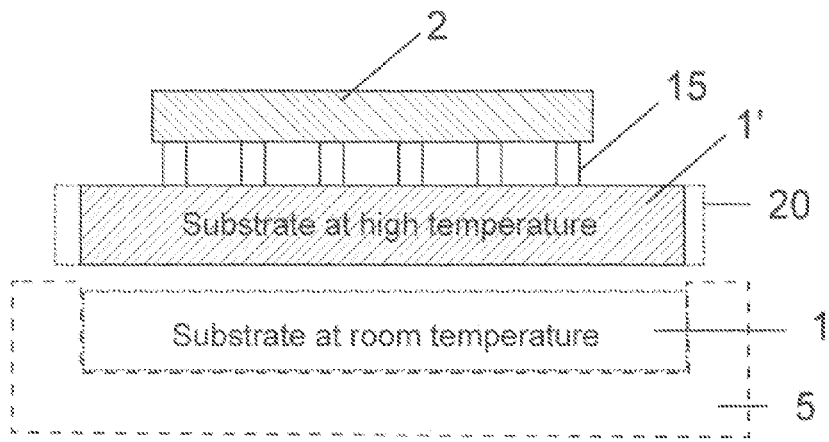
FIGS. 16c-16d illustrates the present invention being applied to reflow.
Figure 16D:
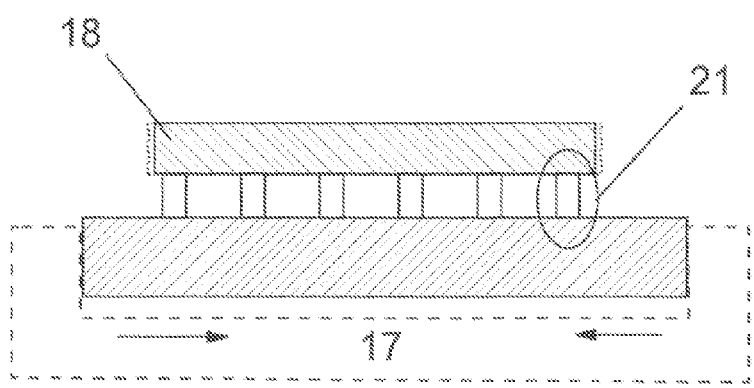

For example, FIGS. 16a-16b show a conventional method directed to reflow, whereas FIGS. 16c-16d illustrate the present invention being applied to reflow which is conducted typically prior to when the underfill is applied.

FIG. 16a shows a conventional solder reflow at high temperature, and shows the substrate 1 at room temperature and solder (e.g., bumps) 15 which are applied at high temperature (i.e., in an oven or the like) to attach a die 2 to the substrate 1'.

FIG. 16b shows a cool-down condition after solder reflow, in which there is a 100 µm contraction (as shown by reference numeral 17) of the substrate and a corresponding 25 µm contraction of silicon as shown at reference numeral 18. The high strain on the solder ball leads to failure of the joint as shown at reference numeral 19. That is, the solder does not strain (creep) fast enough when the structure is taken out of the oven and hence stress builds up typically at the joint and failure occurs either at the C4 solder, or in the elements surrounding the C4 that constitutes the BLM structure and the dielectric layers built on a die for circuit functions.

In contrast, with the invention, FIG. 16c shows a solder reflow process at high temperature according to the present invention, and shows the substrate 1 at room temperature and solder (e.g., bumps) 15 which are applied at high temperature (i.e., in an oven or the like) to attach a die 2 to the substrate 1'.

A tub/tray 5 is shown to snug-fit and constrain the substrate 1 during the cool down process. Reference numeral 20 shows the unconstrained length of the substrate at high temperature.

FIG. 16d shows a cool-down condition after solder reflow, in which there is a 100 μm contraction (as shown by reference numeral 17) of the substrate and a corresponding 25 μm contraction of silicon of the tub/tray 5 (also made of ceramic or silicon), as shown at reference numeral 18.

However, in contrast to the situation in FIG. 16b and as shown at reference numeral 21, there is minimal strain on the solder ball which protects the joint from failure since the materials of the substrate and the tray (tub) are substantially the same and contraction is occurring at the same rate and in the same direction. Hence, the solder balls do not see any particular form of strain, and there will be no opportunity for rupture of the solder. Again, there is no differential motion.

Thus, the invention can be used for underfill cure and/or solder reflow advantageously.

Regarding some nominal expansion lengths of an organic substrate that represent a typical gap between the edge of a substrate and an adjustable gap-controlling element required, the following exemplary dimensions and values are offered: e.g., Solder reflow case:
  Increase in temperature (delta-T)=200 deg C.
  Nominal length (L)=50 mm
  Thermal expansion coefficient 0a)=20 ppm/C.
  change in length=L*a*delta-T=50*20*200/10^6 mm=200 μm=(8 mil)

This means that for such a design point, the gap controlling element should be able to choose between 0-200 μm gap in order to have an influence in the expansion characteristics of a substrate.

For the underfill cure process, the rise temperature is about 100 deg C., and the corresponding length change is 100 μm.

A plurality of die/substrate assemblies may be provided. For example, FIG. 17a illustrates a top view of a structure 170 which includes a plurality (e.g., 8) die 171/substrate 172 (shown in FIG. 17b which is a cross-sectional view of structure 170 along lines X-X) assemblies on a manufacturing tray using frictional loading as an example. The tray includes a top friction plate 173 and a bottom friction plate 174. There is also an opening 175 for placement of the silicon die 171. Additionally, there is a slitted diagonal portion 176 for complaint normal loading fingers. Friction fingers 177 with normal loads (part of top plate). These figures clearly show means for processing the assembly and means for introducing the pre-stress for multiple assemblies.

FIG. 18a illustrates a ball limiting metal (BLM) structure 180, and FIG. 18b illustrates detail 181 of FIG. 18a. This structure safeguards the delicate members which support the C4 reflow processes, including a low-k dielectric material 182 shown in FIG. 18b.

Specifically, FIG. 18a illustrates a structure 180 including a die 2 on substrate 1 connected by connections 15 (e.g., solder bumps 15). Detail 181 is shown in FIG. 18b. In FIG. 18b, detail 181 illustrates the detailed interface between the die 2 and the connection 15 (e.g., solder bump 15).

Specifically, die 2 includes a low-k dielectric material 182 (e.g., a material having a low dielectrical value) having a porosity (air being a good solution), thereby providing good electrical decoupling. Generally, low-key dielectric materials have a low/poor modulus of crack strength and tend to rupture under some conditions, which is disadvantageous. However, the present invention may employ low-k dielectrics, as shown in FIGS. 18a-18b, and can overcome (or minimize) their problems of poor crack strength by monitoring the die/substrate assembly as it cools down.

Above the bump 15 is a series of metals or metallization layers (e.g., formed of metal and/or metal alloy) (generally 3-5 layers may be advantageously used) which form the ball limiting metal (BLM) 183. A contact 184 is electrically attached to the BLM 183 and provides an electrical connection (conduction path) thereto/therefrom. A conductive plate 185 leads from the contact 184 to other electrical circuitry (components such as transistors, resistors, capacitors, etc.) (not shown). Similarly, there is a contact (not referenced) and conductive plate (not referenced) below the bump 15.

Thus, as described above, with the invention, a pre-stress is applied to a substrate during a cure process. The method and structure of the present invention provide an additional design freedom, thereby to enhance the manufacturing and minimizing the deformation aspects of providing a die on an electronic (organic) substrate.

While the invention has been described in terms of several exemplary embodiments, those skilled in the art will recognize that the invention can be practiced with modification within the spirit and scope of the appended claims.

Further, it is noted that, Applicant's intent is to encompass equivalents of all claim elements, even if amended later during prosecution.

What is claimed is:

1. A method of assembling a die on an electronic substrate, comprising:
  processing an assembly comprising a substrate and a die; and
  during said processing, introducing a pre-stress to the substrate during a cure process.

2. The method of claim 1, wherein said substrate comprises an organic substrate, and
  wherein said introducing said pre-stress comprises at least one of:
    inserting a wedge element to contact said substrate; and
    modifying a warpage deflection of said substrate at a predetermined temperature.

3. The method of claim 1, wherein a solder joint is formed between said die and said substrate, said method further comprising:
  reducing a peak strain in said solder joint between said die and said substrate.

4. The method of claim 1, wherein said introducing said pre-stress comprises placing said substrate into a tray,
  wherein a choice of a coefficient of thermal expansion (CTE) of a material of said tray is selected to modify at least one of a warpage characteristic and a stress characteristic of said assembly, and
  wherein said placing comprises placing said substrate so that said substrate is snug-fit into said tray such that a predetermined clearance is provided between walls of said substrate and said tray.

5. The method of claim 1, wherein said processing said assembly comprises one of:
  providing a C4 solder reflow process to attach the assembly to an electronic substrate; and
  providing an underfill between said die and said substrate, and curing said underfill; and
  providing a solder reflow process to attach the assembly to a system board.

6. The method of claim 1, wherein said introducing said pre-stress comprises placing said substrate into a tray, and
  wherein the substrate is placed in said tray at room temperature, wherein said tray is shaped to provide a snug-fit between said tray and said substrate such that a gap between the substrate edge and the walls of the tray is selectively controlled.

7. The method of claim 6, further comprising:
selectively choosing a coefficient of thermal expansion (CTE) of said tray to match that of said die.

8. The method of claim 6, further comprising:
imparting a warpage characteristic to the assembly by choosing a tray material having at least one of a different CTE and a different clearance associated with the snug fit.

9. The method of claim 6, wherein the substrate is mechanically constrained by said tray while an underfill is being thermally set during the cure process.

10. The method of claim 6, wherein the die comprises silicon, and
wherein the pre-stress is produced by the tray on the substrate such that the pre-stress imparted on the substrate is borne by the tray and not by an underfill or the die silicon at lower than a glass transition temperature.

11. The method of claim 4, wherein the material of the tray contracts by a substantially same amount as the die, such that the assembly cools down to a substantially stress-free state at a predetermined lower temperature.

12. The method of claim 4, wherein said pre-stress is provided by positioning a wedge insert between the substrate and the tray, thereby to constrain the substrate,
wherein the wedge comprises a material substantially the same as that of the tray, and
wherein said pre-stress is provided by selectively adjusting a pre-load on said substrate via a pressure device.

13. The method of claim 1, wherein said pre-stress is provided by selectively adjusting a pre-load on said substrate, said pre-stress being applied by a sliding block activated by a pressure device.

14. The method of claim 1, wherein said pre-stress is provided by selectively adjusting a pre-load on said substrate.

15. The method of claim 4, further comprising:
positioning said substrate in said tray to at least one of:
preventing said substrate from buckling under compressive stresses generated by a thermal expansion process; and
constraining the substrate to a surface of the tray through friction, said tray being devoid of walls.

16. The method of claim 4, further comprising:
attaching, via an epoxy, the substrate to the tray surface prior to the processing; and
after processing and cooling the assembly, releasing the substrate.

17. The method of claim 1, wherein said introducing said pre-stress comprises inserting the substrate into a tray.

18. The method of claim 1, wherein said introducing said pre-stress comprises inserting the substrate into a constraining member configured to constrain an expansion of the substrate.

19. The method of claim 17, wherein the substrate is inserted into the tray such that there is no clearance between the tray and the substrate.

* * * * *